(12) United States Patent
Fang et al.

(10) Patent No.: US 8,312,399 B2
(45) Date of Patent: Nov. 13, 2012

(54) METHOD AND SYSTEM FOR GENERATING PARTITIONED MATRICES FOR PARALLEL CIRCUIT SIMULATION

(75) Inventors: Gang Peter Fang, Plano, TX (US); Ning Dong, Plano, TX (US); Zhongze Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 312 days.

(21) Appl. No.: 12/604,185

(22) Filed: Oct. 22, 2009

(65) Prior Publication Data

US 2011/0098990 A1    Apr. 28, 2011

(51) Int. Cl.
*G06F 17/50* (2006.01)

(52) U.S. Cl. ........ 716/105; 716/103; 716/104; 716/124; 716/125; 716/131; 716/136; 703/13; 703/14

(58) Field of Classification Search .......... 716/104–105, 716/124, 131, 136; 703/13–14
See application file for complete search history.

(56) References Cited

U.S. PATENT DOCUMENTS

| | | | | |
|---|---|---|---|---|
| 5,442,569 | A | * | 8/1995 | Osano ........................... 716/107 |
| 5,946,479 | A | * | 8/1999 | Sakaguchi et al. ............. 716/51 |
| 6,144,932 | A | * | 11/2000 | Hachiya ........................... 703/14 |
| 6,577,992 | B1 | | 6/2003 | Tchemiaev et al. |
| 7,237,214 | B1 | * | 6/2007 | Pandey et al. .................. 716/131 |

OTHER PUBLICATIONS

Aykanat et al., (Permuting sparse rectangular matrices into block diagonal form, 2004, Siam J. Comput. vol. 28, No. 6, p. 1860-1879).*
"Direct Circuit Simulation Algorithms for Parallel Processing," IEEE Transactions on Computer-Aided Design, vol. 10, Jun. 5, 1991, pp. 714-725 (Paul F. Cox, Richard G. Burch, Dale E. Hocevar, Ping Yang and Berton D. Epler).
"Parallel LU Factorization for Circuit Simulation on a MIMD Computer," ICCC 1988, pp. 129-132 (Chien-Chih Chen and Yu-Hen Hu).
"A Multilevel Newton Algorithm With Macromodeling and Latency for the Analysis of Large-Scale Nonlinear Circuits in the Time Domain," TCAD, Sep. 1979, pp. 733-741 (N.B. Guy Rabbat, Alberto L. Sangiovanni-Vincentelli and Hsueh Y. Hsieh).

* cited by examiner

*Primary Examiner* — Nghia Doan
(74) *Attorney, Agent, or Firm* — John J. Patti; Wade J. Brady, III; Frederick J. Telecky, Jr.

(57) ABSTRACT

Over the years, parallel processing has become increasingly common. Conventional circuit simulators have not taken full advantage of these developments, however. Here, a circuit simulator and system are provided that partitions circuit matrices to allow for more efficient parallel processing to take place. By doing this, the overall speed and reliability of the circuit simulator can be increased.

12 Claims, 7 Drawing Sheets

METHOD AND SYSTEM FOR GENERATING PARTITIONED MATRICES FOR PARALLEL CIRCUIT SIMULATION

TECHNICAL FIELD

The invention relates generally to a circuit simulator and, more particularly, to matrix partitioning for a circuit simulator.

BACKGROUND

Computer-based circuit simulators enable the analysis of complex circuits before the time and expense of building a circuit is incurred. In general, a circuit simulator is a software application that analyzes a circuit design to predict its behavior under a given set of conditions or assumptions. Typically, the description of the circuit is comprised of sets of equations describing the desired behavior of the circuit, and the simulator solves these equations in the context of simulated conditions represented by stimuli applied to the circuit in order to simulate operation under those conditions.

A circuit simulator typically constructs circuit equations from mathematical models of the components within the circuit. The mathematical models may be provided in the circuit simulator (i.e., the semiconductor device models of SPICE-like simulators), and/or may be specified by a user using a hardware description language (e.g., Verilog-AMS, Verilog-A). The circuit simulator combines the mathematical models of the components with equations that describe the interconnection of the components to construct a set of nonlinear differential algebraic equations (DAEs) that describe the circuit. In many circuit simulators, the circuit equations are derived from Kirchoffs voltage and current laws which require that the sum of all currents flowing out of a node at any instant is zero and the algebraic sum of all branch voltages around a loop at any instant is zero.

A circuit simulator may be used to perform many different types of analysis on a circuit. One analysis in particular, transient analysis, is often very tasking. Transient runs or simulations for full-chip mixed-signal designs at transistor level usually take days or even weeks to complete, and these simulations may significantly impact the design circle time. During these transient runs, a circuit simulator generally spends most of processor time evaluating device models and solving the circuit matrices. While the loop of device evaluation can be easily parallelized on shared memory architectures using a fine-grained scheme, scalable parallel matrix solving is difficult to achieve. Therefore, the matrix solver is often the bottleneck of a parallel circuit simulator, indicating a need for improving the efficiency of the matrix solver.

Some examples of conventional simulators are: Cox et. al., "Direct Circuit Simulation for Parallel Processing", *TCAD*, June 1991; Chen et al., "Parallel LU Factorization for Circuit Simulation on a MIMD Computer", *ICCC* 1988; Rabbat et al., "A Multilevel Newton Algorithm with Macromodeling and Latency for the Analysis of Large-Scale Nonlinear Circuits in the Time Domain." TCAD, September 1979; and U.S. Pat. No. 6,577,992;

SUMMARY

A preferred embodiment of the present invention, accordingly, provides a system with a plurality of processors having a computer program product embodied thereon. The computer program product comprises computer code for generating a matrix representation of a circuit design; computer code for applying a hypergraph partitioner to the matrix representation so as to convert the matrix representation into a first bordered block diagonal (BBD) matrix having a first set of diagonal submatrices and a set of border submatrices, wherein each border submatrix from the set of border submatrices is associated with at least one of the diagonal submatrices from the first set of diagonal submatrices; computer code for reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix; computer code for associating each of the diagonal submatrices from the second set of diagonal submatrices with at least one of the processors; computer code for solving each of the diagonal submatrices from the second set of diagonal submatrices; and computer code for solving the interconnect submatrix at least after each of the diagonal submatrices from the second set of diagonal submatrices have been solved.

In accordance with a preferred embodiment of the present invention, the computer code for applying the hypergraph partitioner further comprises: computer code for associating at least one row with a vertex and at least one column with a hyperedge; and computer code for minimizing the number of hyperedge cuts.

In accordance with a preferred embodiment of the present invention, the computer code for reordering further comprises: computer code for interchanging rows from the first BBD matrix for pivoting and suboptimal fill-in reduction; and computer code for assembling the set of row border submatrices and the interconnect submatrix.

In accordance with a preferred embodiment of the present invention, an apparatus is provided. The apparatus comprises a plurality of processors; a communication channel that is coupled to each processor; and a storage medium having a computer program stored thereon that is coupled to the communication channel, wherein the processors are adapted to execute the computer program product, and wherein the computer program product includes: computer code for generating a matrix representation of a circuit design; computer code for applying a hypergraph partitioner to the matrix representation so as to convert the matrix representation into a first BBD matrix having a first set of diagonal submatrices and a set of border submatrices, wherein each border submatrix from the set of border submatrices is associated with at least one of the diagonal submatrices from the first set of diagonal submatrices; computer code for reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix; computer code for associating each of the diagonal submatrices from the second set of diagonal submatrices with at least one of the processors; computer coder for solving each of the diagonal submatrices from the second set of diagonal submatrices; and computer code for solving the interconnect submatrix at least after each of the diagonal submatrices from the second set of diagonal submatrices have been solved.

In accordance with a preferred embodiment of the present invention, the plurality of processors are included on a signal integrated circuit.

In accordance with a preferred embodiment of the present invention, the communication channel further comprises a bus.

In accordance with a preferred embodiment of the present invention, the storage medium further comprises: random access memory (RAM) that is coupled to the bus; and a hard disk drive that is coupled to the bus.

In accordance with a preferred embodiment of the present invention, a method executed in an electronic data processing system having a plurality of processors is provided. The method comprises generating a matrix representation of a circuit design; applying a hypergraph partitioner to the matrix representation so as to convert the matrix representation into a first BBD matrix having a first set of diagonal submatrices and a set of border submatrices, wherein each border submatrix from the set of border submatrices is associated with at least one of the diagonal submatrices from the first set of diagonal submatrices; reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix; associating each of the diagonal submatrices from the second set of diagonal submatrices with at least one of the processors; solving each of the diagonal submatrices from the second set of diagonal submatrices; and solving the interconnect submatrix at least after each of the diagonal submatrices from the second set of diagonal submatrices have been solved.

In accordance with a preferred embodiment of the present invention, the step of applying the hypergraph partitioner further comprises: associating at least one row with a vertex and at least one column with a hyperedge; and minimizing the number of hyperedge cuts.

In accordance with a preferred embodiment of the present invention, the step of reordering further comprises: interchanging rows from the first BBD matrix for pivoting and suboptimal fill-in reduction; and assembling the set of row border submatrices and the interconnect submatrix.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1:
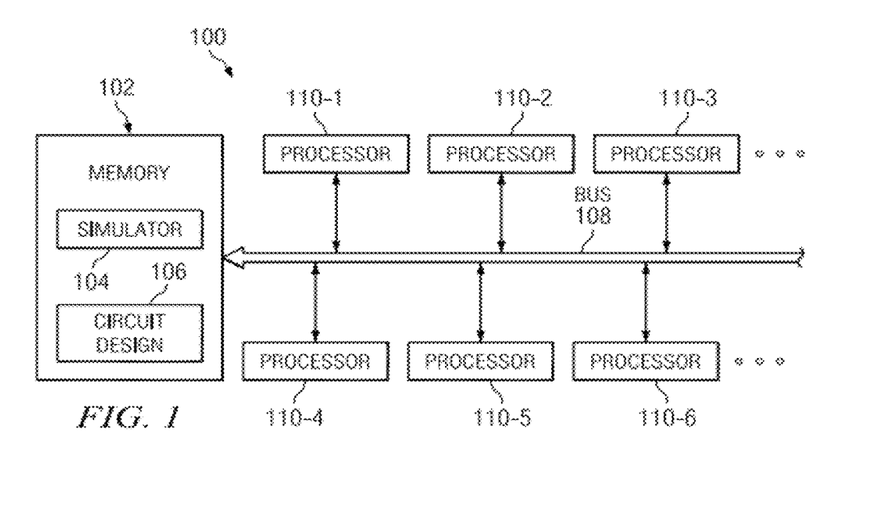
FIG. 1 is a block diagram of an example of system in accordance with a preferred embodiment of the present invention.

Referring to FIG. 1 of the drawing an example of system 100 in accordance with a preferred embodiment of the present invention is shown. System 100 is generally comprised of a storage medium or memory 102, a communication channel or bus 108, and processors 110-1 to 110-6. Typically, system 100 is implemented as a personal computer (PC) or a conventional packed switched network (with each enabled to perform parallel processing or multi-threading). Preferably, processors 110-1 to 110-6 are included on a single integrated circuit or multi-core processor, while the memory 102 is generally comprised of random access memory (RAM) and a hard disk drive.

In operation, the memory 102, bus 108, and processors 110-1 to 110-6 operate to simulate a circuit design 106. Specifically, a user provides the circuit design to system 100. The simulator 104, which is generally a computer program that can be executed on processors 110-1 to 110-6 in parallel, is able to determine the operation of the circuit design 106 as specified by the user by converting the circuit design 106 to a matrix representation and performing calculations.

Figure 2:
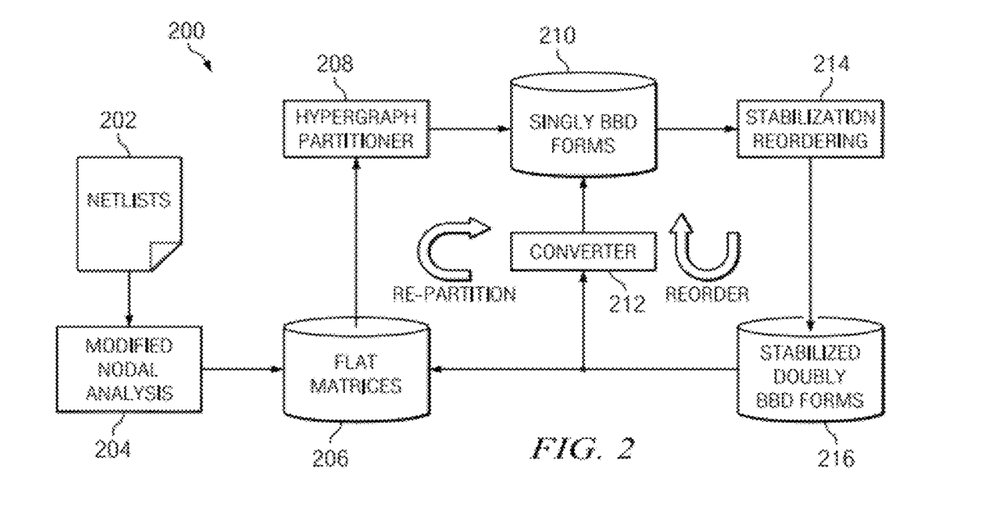
FIG. 2 is a block diagram of an example of the organizational structure of the partitioner employed in the system of FIG. 1.
Figure 3A:
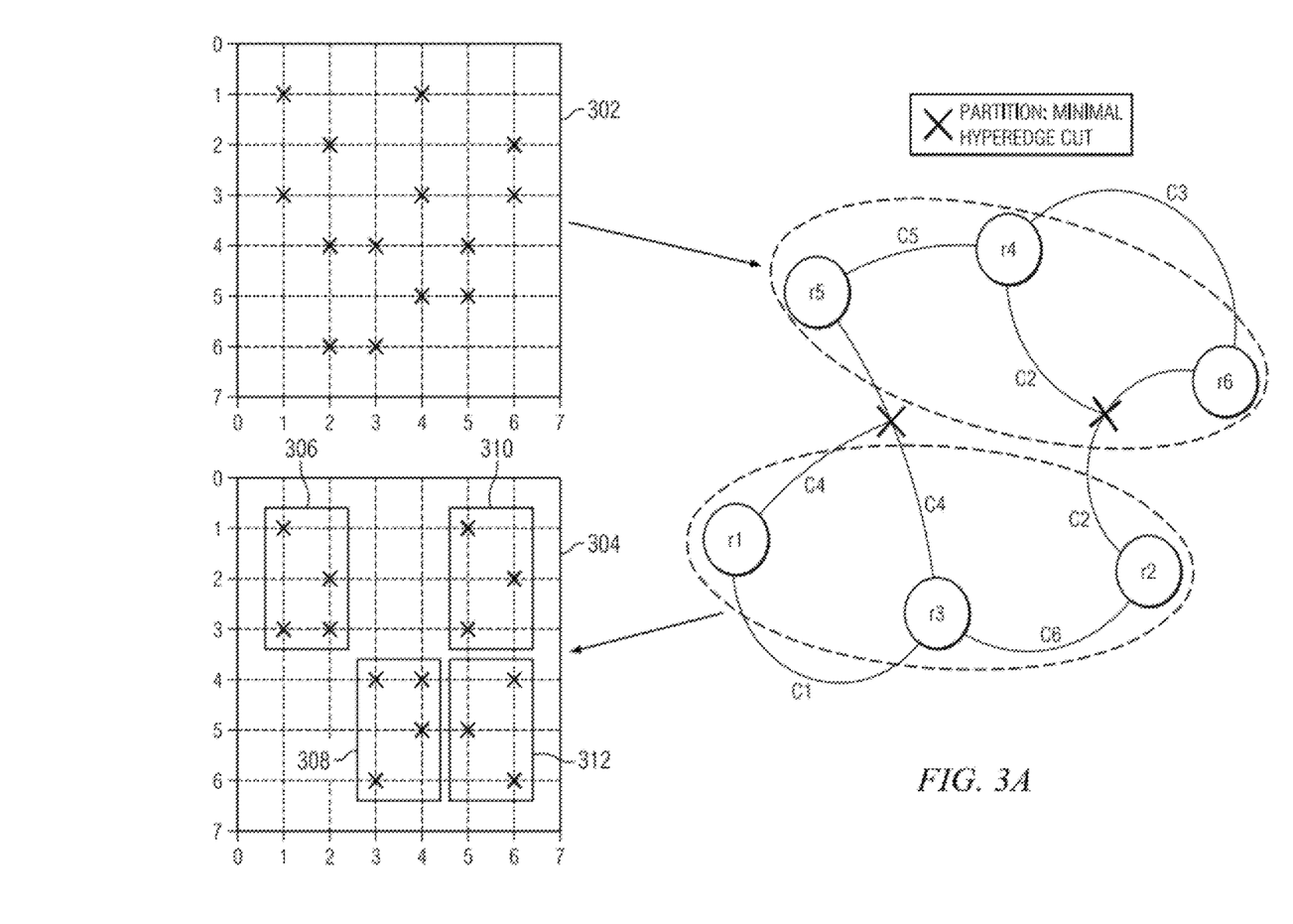
FIGS. 3A through 3B are block diagrams that depict the operation of the partitioner of FIG. 2.
Figure 3B:
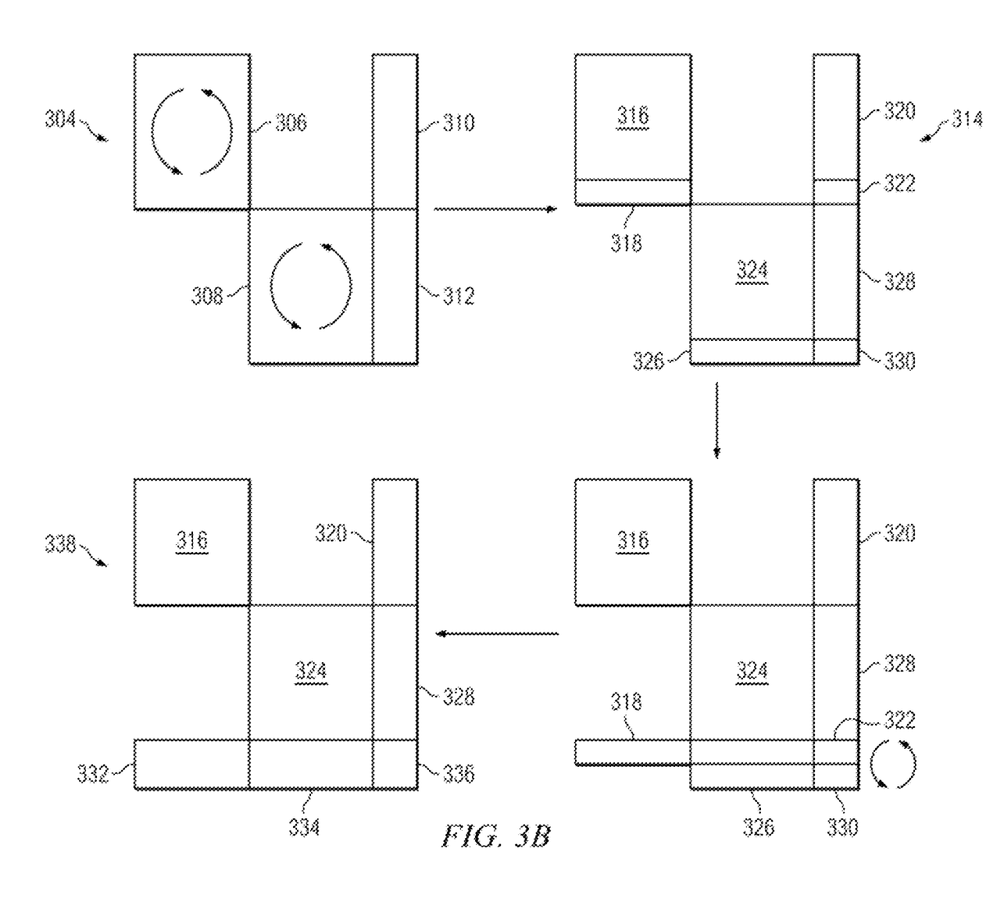

One component of the simulator 104 is the partitioner 200, which can be seen in FIGS. 2, 3A, and 3B. The partitioner 200 generally converts the circuit design 106 into a stabilized doubly bordered block diagonal (BBD) matrix representation of the circuit design 106. Preferably, partitioner 200 employs netlists 202 and a modified nodal analysis module 204 to convert the circuit diagram into a generally flat matrix representation, which can be seen, for example, as reference numeral 302 of FIG. 3A. Usually, this matrix representation is based on the application of the application of physical laws that are applied to each element of the circuit design 106 at the transistor and component level (i.e., Kirchoff's law). This flat matrix representation is stored in database 206.

Once stored, the hypergraph partitioner 208 can convert the generally flat matrix representation of the circuit design 106 to a singly BBD matrix. As an example (which can be seen in FIG. 3A), the flat matrix representation 302 is generally sparse, having few non-zero entries. The hypergraph partitioner 208 reorders the matrix 302 using a hypergraph model (for example, a one-dimensional hypergraph model) with rows as vertices and columns as hyperedges (where hyperedge cuts, which are described by example below, are minimized) so as to form a singly BBD matrix 304. When converted, the singly BBD matrix 304 generally comprises diagonal submatrices 306 and 308 and associated border matrices 310 and 312. This singly BBD matrix 304 can then be stored in database 210.

The stabilization reordering module 214 can then reorder the singly BBD matrix 304 to generate a stabilized doubly BBD matrix 338. Preferably, module 214 employs pivoting and suboptimal fill-in reduction to perform this reordering. Generally, module 214 reorders diagonal submatrices 306 and 308 and their corresponding border submatrices 310 and 312 to form row bands 318, 326, 322, and 330 in submatrices 306, 308, 310, and 312 (respectively). Module 214 interchanges rows to arrange the bands 318, 326, 322, and 330 along the border, leaving diagonal submatrices 316 and 324 and column border submatrices 320 and 328 in place. Partial pivoting and fill reduction are performed on the bands 318, 326, 322, and 330 by module 214 to form row border submatrices 332 and 334 and interconnect submatrix 336. The resulting BBD matrix 338, thus, includes several submatrices that can be solved independently of one another. One partition or ordering, however, may be insufficient. In such cases, the BBD matrix 338 can be repartitioned by being stored in the database 206 or may be converted back to a singly BBD matrix by converter 212.

Figure 4A:
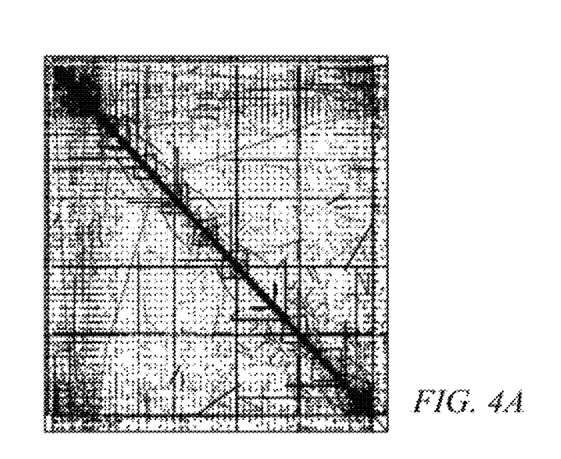
FIGS. 4A through 4D are examples of a flat matrix and matrices with 2-way, 4-way, 8-way partitioning.
Figure 4B:
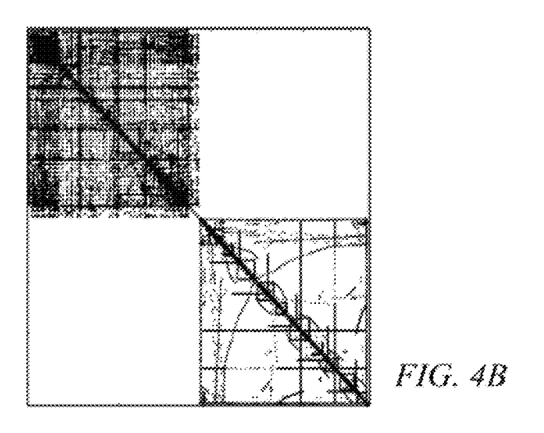
Figure 4C:
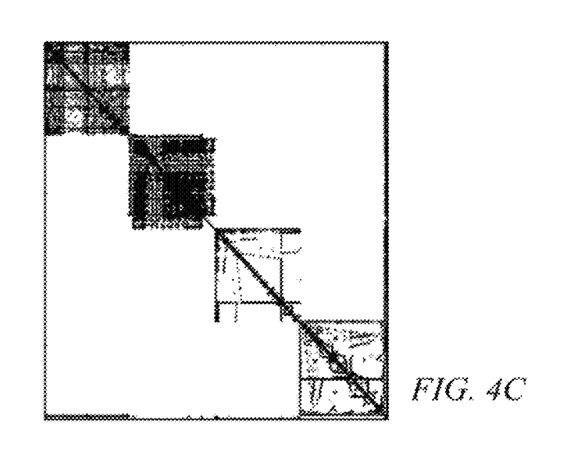
Figure 4D:
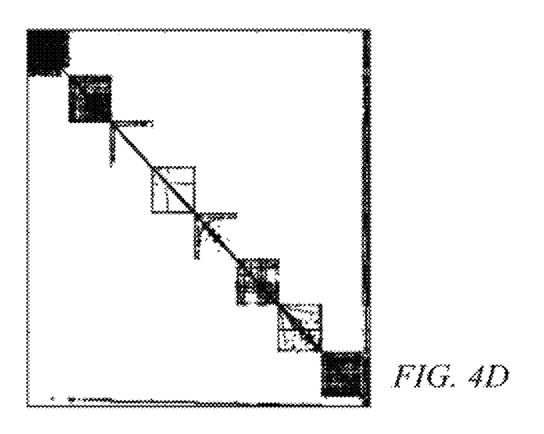

Turning to FIGS. 4A through 4D, an example of multi-way partitioning can be seen. A flat matrix is shown in FIG. 4A within 149,127 equations and 709,157 non-zero entries. In FIG. 4B, the matrix of FIG. 4A has been partitioned into two diagonal submatrices with a border size of 1,130 entries or 0.7% of the matrix of FIG. 4B. In FIG. 4C, the matrix of FIG. 4A has been partitioned into four diagonal submatrices with a border size of 2,112 entries or 1.4% of the matrix of FIG. 4C. In FIG. 4D, the matrix of FIG. 4A has been partitioned into eight diagonal submatrices with a border size of 3,414 entries or 2.3% of the matrix of FIG. 4D.

Tuning now to FIGS. 5A through 5F, a partitioning for a simple Resistor-Inductor-Capacitor (RLC) network 500 can be seen. Network 500 generally comprises a voltage source V1, resistors R1 through R4 (which each have a value of about 1 kΩ) and R5 (having a value of about 10 kΩ), capacitors C1 through C4 (which each have a value of about 10 pF) and C5 (which has a value of about 20 pF), and inductors L1 through L4 (which each have a value of about 1 nH). As applied to network 500, the flat matrix representation 502 is generates by netlist 202 and module 204 of FIG. 2.

Once the flat matrix 502 is stored in database 206, a 2-way hypergraph partitioning is performed by partitioner 208 of FIG. 2 by treating the rows of matrix 502 as the vertices of the hypergraph and the columns of matrix 502 as the hyperedges, which results in two sub-hypergraphs. The first sub-hypergraph is generally comprised of vertices corresponding to rows 3, 5, 6, 7, 8, 11, and 12 of matrix 502, and the second sub-hypergraph is generally comprised of rows 1, 2, 4, 9, 10, 13 and 14 of matrix 502. If rows in the first sub-hypergraph are listed first, followed by the rows from the second sub-hypergraph, the reordered matrix 504 of FIG. 5C results.

Figure 5A:
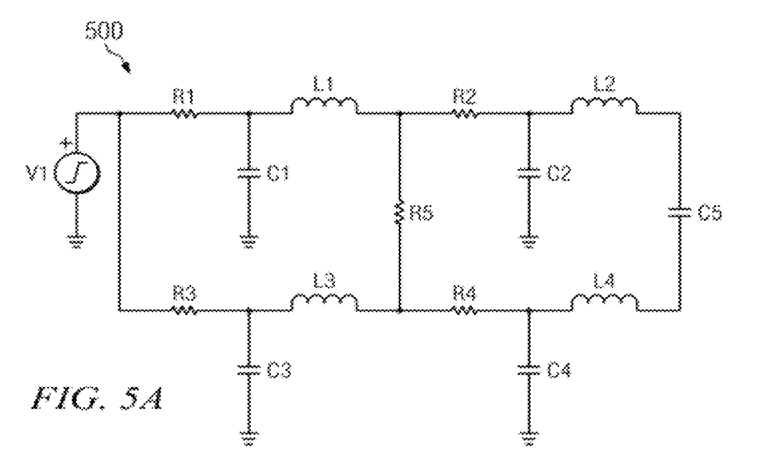
FIG. 5A through 5F are diagrams depicting an example circuit and its matrix being partitioned by the partitioner of FIG. 2.
Figure 5B:
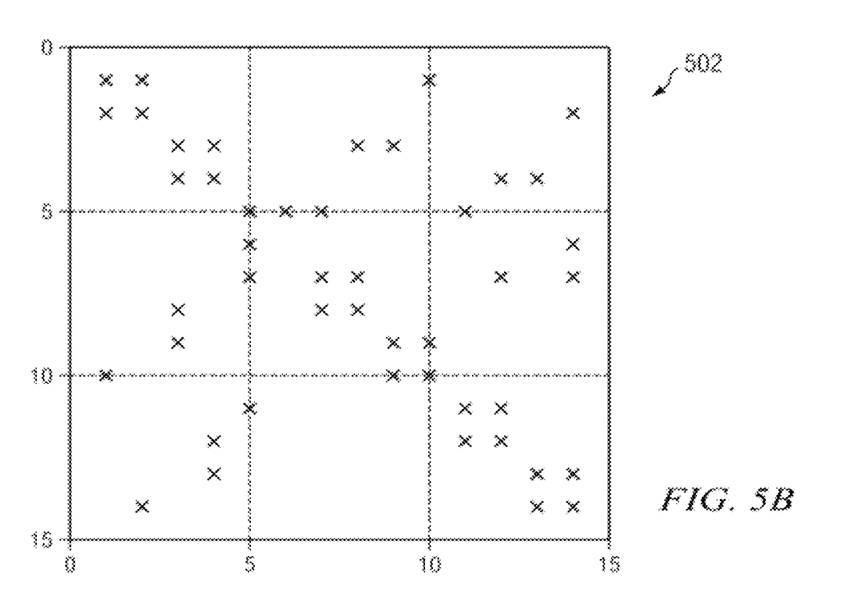
Figure 5C:
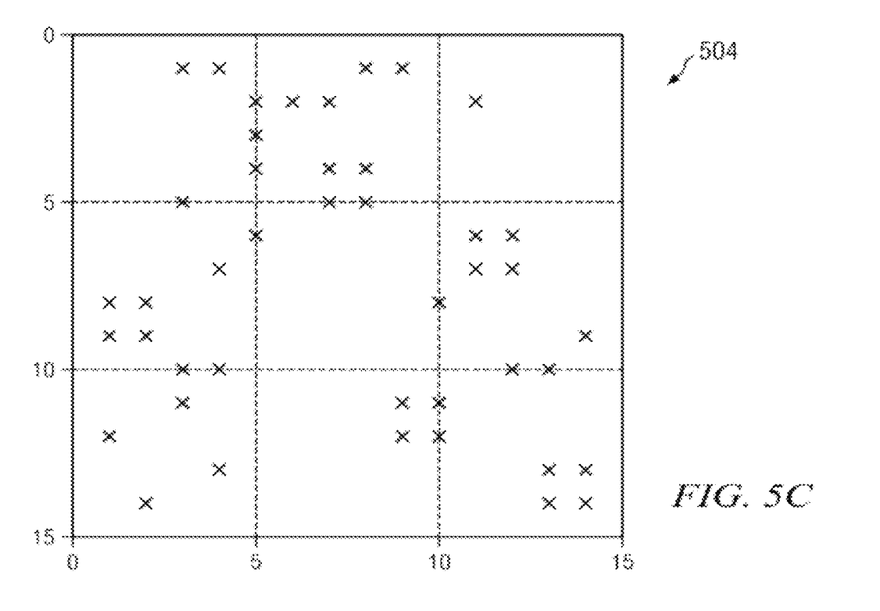
Figure 5D:
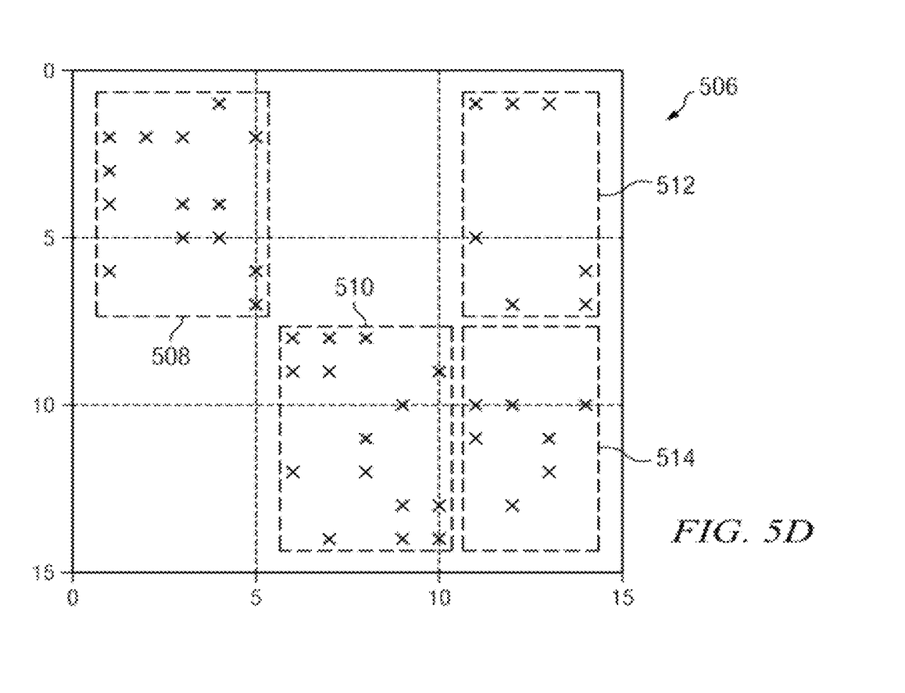

With matrix 504 complete, the hyperedges corresponding to columns 3, 4, 9 and 12 of matrix 504 are connected to both sub-hypergraphs, which are referred to as "cut hyperedges." If all non-cut hyperedges of matrix 504 are listed followed by the cut hyperedges, the original matrix of FIG. 5A is accordingly transformed to the singly BBD matrix 506 as illustrated in FIG. 5D. As can clearly be seen, there are two diagonal submatrices 508 and 510 and two associated border matrices 512 and 514.

Once matrix 505 has been obtained, a stabilization reordering by module 214 of FIG. 2 is performed. The stabilization reordering is a two-step process as shown below. First, each submatrix in the matrix 506 is reordered for pivoting and suboptimal fill-in reduction. The rows of each submatrix are permuted. Table 1 below shows that the new row number i corresponds to row number perm(i) in the matrix 506.

TABLE 1

| i | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| Perm(i) | 3 | 2 | 4 | 5 | 6 | 1 | 7 | 8 | 12 | 14 | 13 | 9 | 11 | 10 |

Figure 5E:
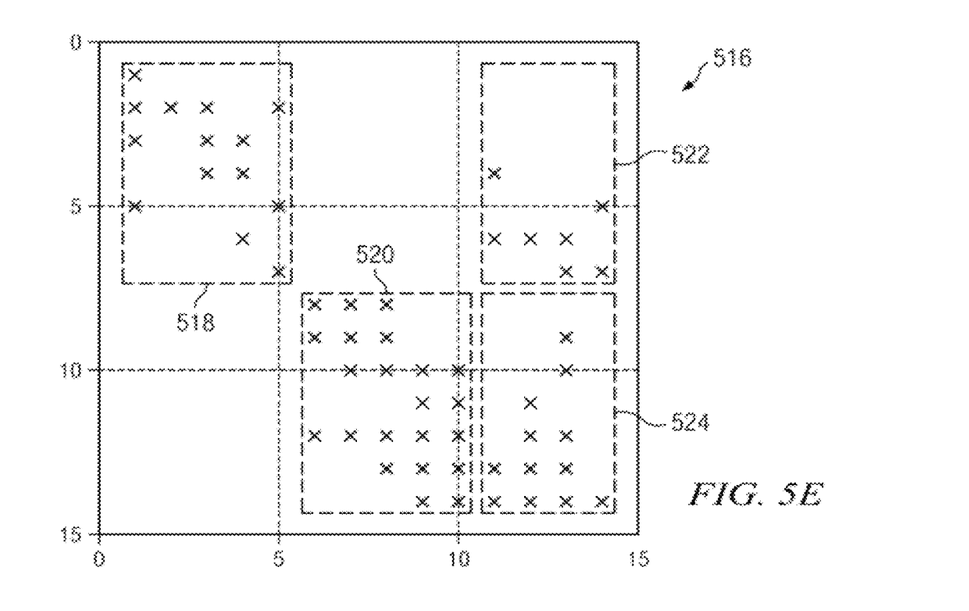
Figure 5F:
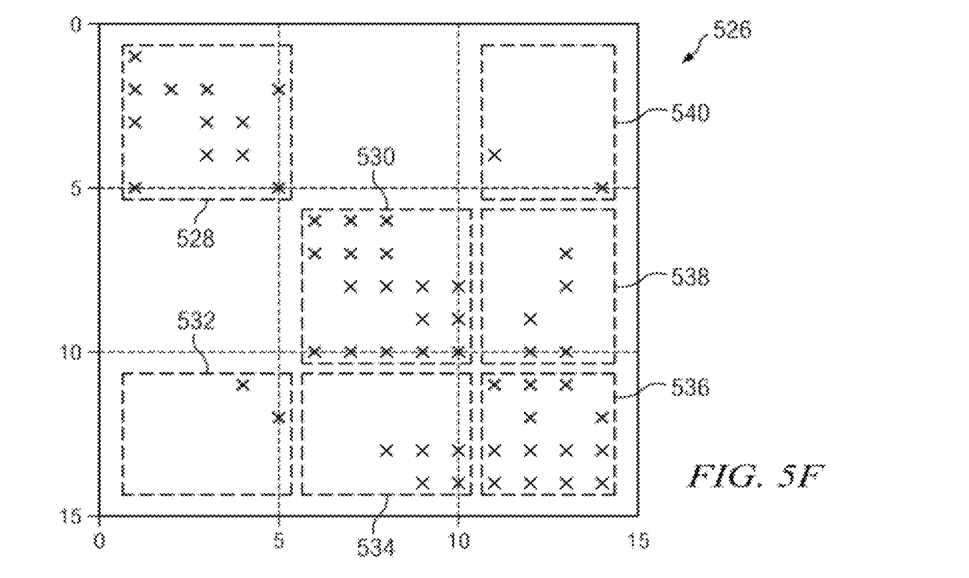

After reordering each submatrix in matrix 506, matrix 516 of FIG. 5E is obtained, which includes diagonal submatrices 518 and 520 and border matrices 522 and 524. Then, row borders and interconnect submatrix are assembled and reordered for pivoting and fill reduction, resulting the desired stabilized doubly BBD matrix 526 as shown in FIG. 5F. As can clearly be seen, this matrix 526 includes two diagonal submatrices 528 and 530, two column border submatrices 540 and 538, two row border matrices 532 and 534, and interconnect submatrix 536.

With a reordered BBD matrix for circuit design 106 of FIG. 1, processors 110-1 to 110-6 can easily solve the matrix in parallel. As has been established above the BBD matrices have the form of:

$$\begin{bmatrix} \overline{A_1} & & & & \overline{B_1} \\ & \overline{A_2} & & & \overline{B_2} \\ & & \ddots & & \vdots \\ & & & \overline{A_q} & \overline{B_q} \\ \overline{C_1} & \overline{C_2} & \cdots & \overline{C_q} & \overline{P} \end{bmatrix} \quad (1)$$

where $\overline{A}_i$ represents the $i^{th}$ diagonal submatrix, $\overline{B}_i$ represents the $i^{th}$ column border submatrix, $\overline{C}_i$ represents the $i^{th}$ row border submatrix, and $\overline{P}$ represents the interconnect submatrix. Accordingly, standard LU decomposition can be employed such that:

$$\begin{bmatrix} \overline{L_1} & & & & \\ & \overline{L_2} & & & \\ & & \ddots & & \\ & & & \overline{L_q} & \\ \widehat{\overline{C_1}} & \widehat{\overline{C_2}} & \cdots & \widehat{\overline{C_q}} & \overline{L_{q+1}} \end{bmatrix}; \quad (2)$$

$$\begin{bmatrix} \overline{U_1} & & & & \widehat{\overline{B_1}} \\ & \overline{U_2} & & & \widehat{\overline{B_2}} \\ & & \ddots & & \vdots \\ & & & \overline{U_q} & \widehat{\overline{B_q}} \\ & & & & \overline{U_{q+1}} \end{bmatrix}; \quad (3)$$

$$\overline{A}_i = \overline{L_i U_i}; \quad (4)$$

$$\widehat{\overline{B}}_i = \overline{L_i}^{-1} \overline{B_i}; \quad (5)$$

$$\widehat{\overline{C}}_i = \overline{C_i U_i}^{-1}; \text{ and} \quad (6)$$

$$\overline{L_{q+1}U_{q+1}} = \overline{P} - \sum_{i=1}^{q} \overline{\overline{B_i}\overline{C_i}}. \tag{7}$$

Thus, equations (2) through (7) can easily be solved in a multi-processor system.

The system 100 and partitioner 200 described above have numerous advantages over the conventional circuit simulators. First, the circuit matrices are partitioned directly; no graph representation is needed for each device model, which is not always available. Second, the use of hypergraph partitioner 208 leads to smaller border size, which is useful for the scalability of parallel processing. Third, stabilization reordering module 214 is able to choose a full set of pivots, making the resulting BBD representation numerically stable. Fourth, this approach is flexible enough to handle significant latency problems.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A system with a plurality of processors having a computer program product embodied thereon, the computer program product comprising:
    computer code for generating a matrix representation of a circuit design;
    computer code for applying a hypergraph partitioner to the matrix representation so as to convert the matrix representation into a first bordered block diagonal (BBD) matrix having a first set of diagonal submatrices and a set of border submatrices, wherein each border submatrix from the set of border submatrices is associated with at least one of the diagonal submatrices from the first set of diagonal submatrices;
    computer code for reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix;
    computer code for associating each of the diagonal submatrices from the second set of diagonal submatrices with at least one of the processors;
    computer code for solving each of the diagonal submatrices from the second set of diagonal submatrices; and
    computer code for solving the interconnect submatrix at least after each of the diagonal submatrices from the second set of diagonal submatrices have been solved.

2. The computer program product of claim 1, wherein the computer code for applying the hypergraph partitioner further comprises:
    computer code for associating at least one row with a vertex and at least one column with a hyperedge; and
    computer code for minimizing the number of hyperedge cuts.

3. The computer program product of claim 1, wherein the computer code for reordering further comprises:
    computer code for interchanging rows from the first BBD matrix for pivoting and suboptimal fill-in reduction; and
    computer code for assembling the set of row border submatrices and the interconnect submatrix.

4. An apparatus comprising:
    a plurality of processors;
    a communication channel that is coupled to each processor; and
    a non-transitory storage medium having a computer program stored thereon that is coupled to the communication channel, wherein the processors are adapted to execute the computer program product, and wherein the computer program product includes:
        computer code for generating a matrix representation of a circuit design;
        computer code for applying a hypergraph partitioner to the matrix representation so as to convert the matrix representation into a first BBD matrix having a first set of diagonal submatrices and a set of border submatrices, wherein each border submatrix from the set of border submatrices is associated with at least one of the diagonal submatrices from the first set of diagonal submatrices;
        computer code for reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix;
        computer code for associating each of the diagonal submatrices from the second set of diagonal submatrices with at least one of the processors;
        computer code for solving each of the diagonal submatrices from the second set of diagonal submatrices; and
        computer code for solving the interconnect submatrix at least after each of the diagonal submatrices from the second set of diagonal submatrices have been solved.

5. The apparatus of claim 4, wherein the computer code for applying the hypergraph partitioner further comprises:
    computer code for associating at least one row with a vertex and at least one column with a hyperedge; and
    computer code for minimizing the number of hyperedge cuts.

6. The apparatus of claim 4, wherein the computer code for reordering further comprises:
    computer code for interchanging rows from the first BBD matrix for pivoting and suboptimal fill-in reduction; and
    computer code for assembling the set of row border submatrices and the interconnect submatrix.

7. The apparatus of claim 4, wherein the plurality of processors are included on a signal integrated circuit.

8. The apparatus of claim 4, wherein the communication channel further comprises a bus.

9. The apparatus of claim 8, wherein the storage medium further comprises:
    random access memory (RAM) that is coupled to the bus; and
    a hard disk drive that is coupled to the bus.

10. A method executed in an electronic data processing system having a plurality of processors, the method comprising:

generating a matrix representation of a circuit design;
applying a hypergraph partitioner to the matrix representation so as to convert the matrix representation into a first BBD matrix having a first set of diagonal submatrices and a set of border submatrices, wherein each border submatrix from the set of border submatrices is associated with at least one of the diagonal submatrices from the first set of diagonal submatrices;
reordering the first BBD matrix to generate a second BBD matrix having a second set of diagonal submatrices, a set of column border submatrices, a set of row border submatrices, and an interconnect submatrix, wherein each column border submatrix is associated with at least one of the diagonal submatrices from the second set of submatrices, and wherein the interconnect submatrix is associated with each row border submatrix;
associating each of the diagonal submatrices from the second set of diagonal submatrices with at least one of the processors;
solving each of the diagonal submatrices from the second set of diagonal submatrices; and
solving the interconnect submatrix at least after each of the diagonal submatrices from the second set of diagonal submatrices have been solved.

11. The method of claim 1, wherein the step of applying the hypergraph partitioner further comprises:
associating at least one row with a vertex and at least one column with a hyperedge; and
minimizing the number of hyperedge cuts.

12. The method of claim 1, wherein the step of reordering further comprises:
interchanging rows from the first BBD matrix for pivoting and suboptimal fill-in reduction; and
assembling the set of row border submatrices and the interconnect submatrix.

* * * * *